United States Patent [19]

Lindner et al.

[11] Patent Number: 5,761,147
[45] Date of Patent: Jun. 2, 1998

[54] VIRTUAL TWO-PORT MEMORY STRUCTURE WITH FAST WRITE-THRU OPERATION

[75] Inventors: Heinrich Lindner, Holzgerlingen; Peter Knott, Herrenberg; Otto Wagner, Altdorf, all of Germany

[73] Assignee: International Business Machines Corporation, Armonk, N.Y.

[21] Appl. No.: 805,531

[22] Filed: Feb. 25, 1997

[30] Foreign Application Priority Data

Feb. 21, 1997 [EP] European Pat. Off. ............ 97102831

[51] Int. Cl.$^6$ .................................................. G11C 8/00
[52] U.S. Cl. ........................ 365/230.05; 365/189.07; 365/230.08; 365/230.01
[58] Field of Search ........................ 365/230.01, 230.05, 365/189.07, 230.08

[56] References Cited

U.S. PATENT DOCUMENTS

| | | | |
|---|---|---|---|
| 5,430,685 | 7/1995 | Nakada | 365/230.05 |
| 5,473,574 | 12/1995 | Clemen et al. | 365/230.05 |
| 5,657,291 | 8/1997 | Podlesny et al. | 365/230.05 |

FOREIGN PATENT DOCUMENTS

| | | |
|---|---|---|
| 1-296486 | 11/1989 | Japan . |
| 2-146181 | 6/1990 | Japan . |
| 3-29185 | 2/1991 | Japan . |
| 3-29187 | 2/1991 | Japan . |
| 3-187095 | 8/1991 | Japan . |
| 5-347096 | 12/1993 | Japan . |

OTHER PUBLICATIONS

"Dense multi-port cell scheme", IBM TDB, vol. 30, No. 7, Dec. 1987, pp. 320–321.
"Reconfigurable single/dual port RAM system", IBM TDB, vol. 29, No. 4, Sep. 1986, pp. 1881–1882.

*Primary Examiner*—Viet Q. Nguyen
*Attorney, Agent, or Firm*—M. A. Ehrlich

[57] ABSTRACT

A virtual two-port memory structure with fast write-thru operation is proposed. The virtual two-port memory structure employs a single-port memory cell (200). Means for comparing (260) compare a read address AR with a write address AW and means (270) for writing data from the data input terminal (250) into the cell (200) are bypassing said data to the data output terminal (280) as well, such that a write-thru operation is enabled if the read address AR matches the write address AW. The data just written into the cell are immediately available as read data within the same cycle. The multiplex unit used in prior art solutions is no longer necessary, the delay caused by this device is omitted and the advantages of the virtual two-port cell requiring less chip space are maintained.

4 Claims, 4 Drawing Sheets

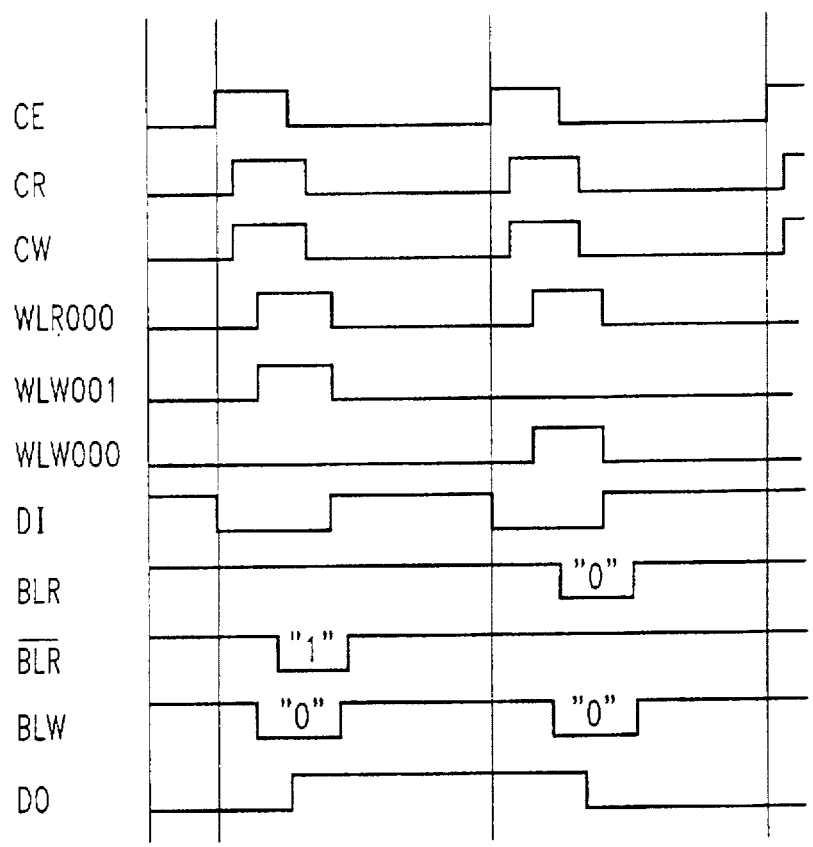
FIG. 2
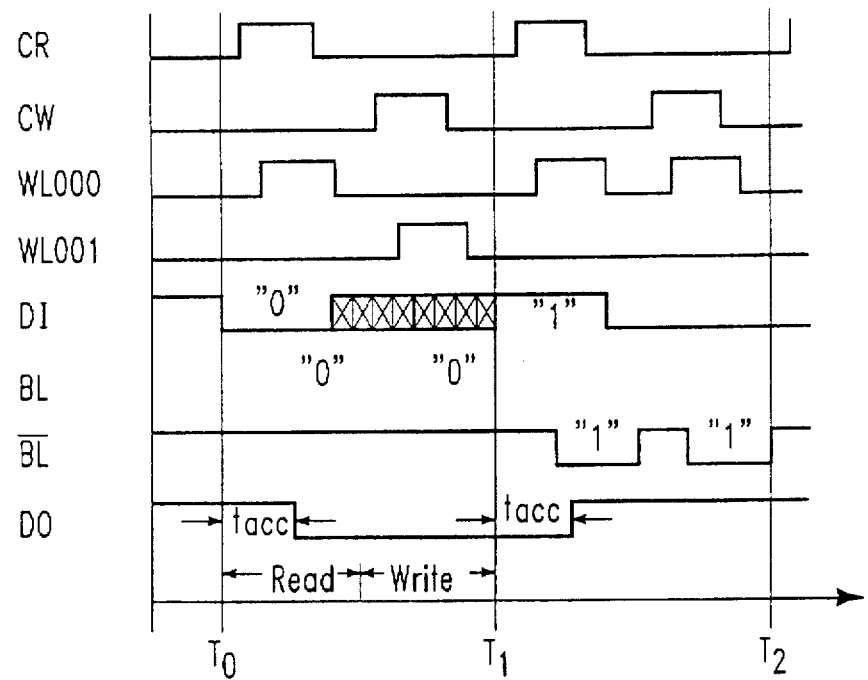
FIG. 4       Read/Write       Write Thru Cycle

VIRTUAL TWO-PORT MEMORY STRUCTURE WITH FAST WRITE-THRU OPERATION

FIELD OF THE INVENTION

The present invention generally relates to semiconductor random access memory (RAM) devices and more particularly to a virtual two-port memory structure which combines the function of a two-port memory cell with a fast write-thru operation and single-port array density and speed.

DESCRIPTION OF THE PRIOR ART

Multi-port RAMs have been developped for high speed applications, such as real time signal processing or parallel data processing. They may be used as main memory to handle large amounts of data simultaneously or as shared cache memory for a plurality of processors.

Multi-port cells with separate read- and write-ports are known from e.g. EP-A-0 554 489. The memory cell is operated in a pipelined mode in which the write and read phases are interleaved. Data to be written are placed onto the write bit line which is connected to the memory cell. The address is strobed from a write address port to a clocked write word line. The contents of a latch in the memory cell is overwritten and a read address is set up to select a static read word line and to read the data out of the latch in the memory cell onto a read bit line.

With these devices reading and writing to one cell during one machine cycle is not a problem and the implementation of a write-thru is straightforward. Because of the different ports necessary these devices however use up a lot of chip space. From EP-A-0 471 932 virtual multi-port cells are known where write- and read-access to a memory cell takes place sequentially via one port.

The virtual multi-port RAM structure has implemented a pipelined memory chip with a single-port RAM array with multiple address and data input ports which are multiplexed to an address bus and a data bus of the array. Internal timing means controll the timing of the single-port array and the cycling of the multiple input ports. The machine cycle is divided in two parts: during the first part, the read access occurs, and during the second part, the write access takes place.

Realizing a write-thru means that read and write access to the same address occurs in the same cycle, and therefore the data which is read from is identical to the data which is written into the cell. Write-thru in the virtual multiport cell is realized with a comparator that compares the read and write addresses and with a multiplexer which outputs the write data as read data when a match occurs. The multiplex unit however causes additional delay.

A two-port array as known in the prior art and shown in FIG. 1 requires a two-port memory cell 100 and each port has its own transfer device. Each of the two wordline systems WLR, WLW of this array has its own phase splitter 112,132, decoder 113,133 and driver 114,134.

The transfer device 180 for read is connected to the read bitline system BLR comprising a sense amplifier 182 and the transfer device 150 for write is connected to the write bitline system BLW comprising a writehead 170.

The additional devices in this known array do not only decrease the density of the array but also increase the length of the bitlines and wordlines. Thus the load to be driven by the wordline driver is increased as well and renders it difficult to achieve short access times.

A write-thru operation indicated by dotted lines 190 within this array is carried out via the write path and the two-port memory cell to the read path. This requires a powerful and fast write path in order to assure a given write-thru access time.

What is needed is an efficient multi-port function implemented in a high density high speed RAM structure that approaches the density and speed of current single-port memory cells and allows fast write-thru operation. A multi-port memory structure of this type can be exploited in the design of many types of computers.

SUMMARY OF THE INVENTION

It is therefore an object of the present invention to provide a memory structure which combines the density and speed of a conventional single-port memory cell with the possibility of performing a read and an independent write access within the same cycle, allowing for a fast write-thru operation.

According to the invention a virtual two-port memory structure is provided that employs a single-port memory cell with a read address terminal, a write address terminal, a data input and a data output terminal.

Comparing means compare a read address AR with a write address AW and means for writing data from the data input terminal into the cell are bypassing said data to the data output terminal as well.

Internal timing means including a write clock and a read clock control the timing of the single-port memory cell, the means for comparing and the means for writing and bypassing data. The means for comparing is connected to the read address terminal, to the write address terminal, to the read clock and to the means for writing and for bypassing data such that a write-thru operation is enabled if the read address AR matches the write address AW.

In the case of write-thru the selected read address and the selected write address are matching. Said matching address is set up on the wordline and the data-in information is written into the memory cell and bypassed to the sense amplifier in the read path. Subsequently the data is read out of the memory cell via the sense amplifier and the data-out latch within the same cycle.

Utilizing the means for comparing to compare read and write address and gating the data to be written to the cell also to the cell's sense amplifier when a match occurs makes the data to be written to the cell immediately available as read data. Thus an efficient write-thru operation can be realized.

The multiplex unit used in prior art solutions is no longer necessary, the delay caused by this device is omitted and the advantages of the virtual two-port cell requiring less chip space are maintained.

As schematically shown in FIG. 5 each sense amplifier SA belongs to a group of cells C1 ... C4 and their respective bitlines BL, with one cell of said group of cells being selected via the low-order bits n of the cell address. The main idea of the invention is to bypass the data to be written into the cell to the sense amplifier in the read data path in a write-thru situation. In order to detect this situation it is no longer necessary to compare the complete read and write addresses; it is sufficient to compare only the low-order bits n of the cell's address which identify a cell out of the group of cells connected to the same sense amplifier.

BRIEF DESCRIPTION OF THE DRAWINGS

FIG. 2 shows a timing diagram of a read/write operation and of a write-thru cycle of the prior art two-port array of FIG. 1

FIG. 4 shows a timing diagram of a read/write operation and of a write-thru cycle of the virtual two-port array of FIG. 3

DETAILED DESCRIPTION OF A PREFERRED EMBODIMENT OF THE INVENTION

Figure 1:
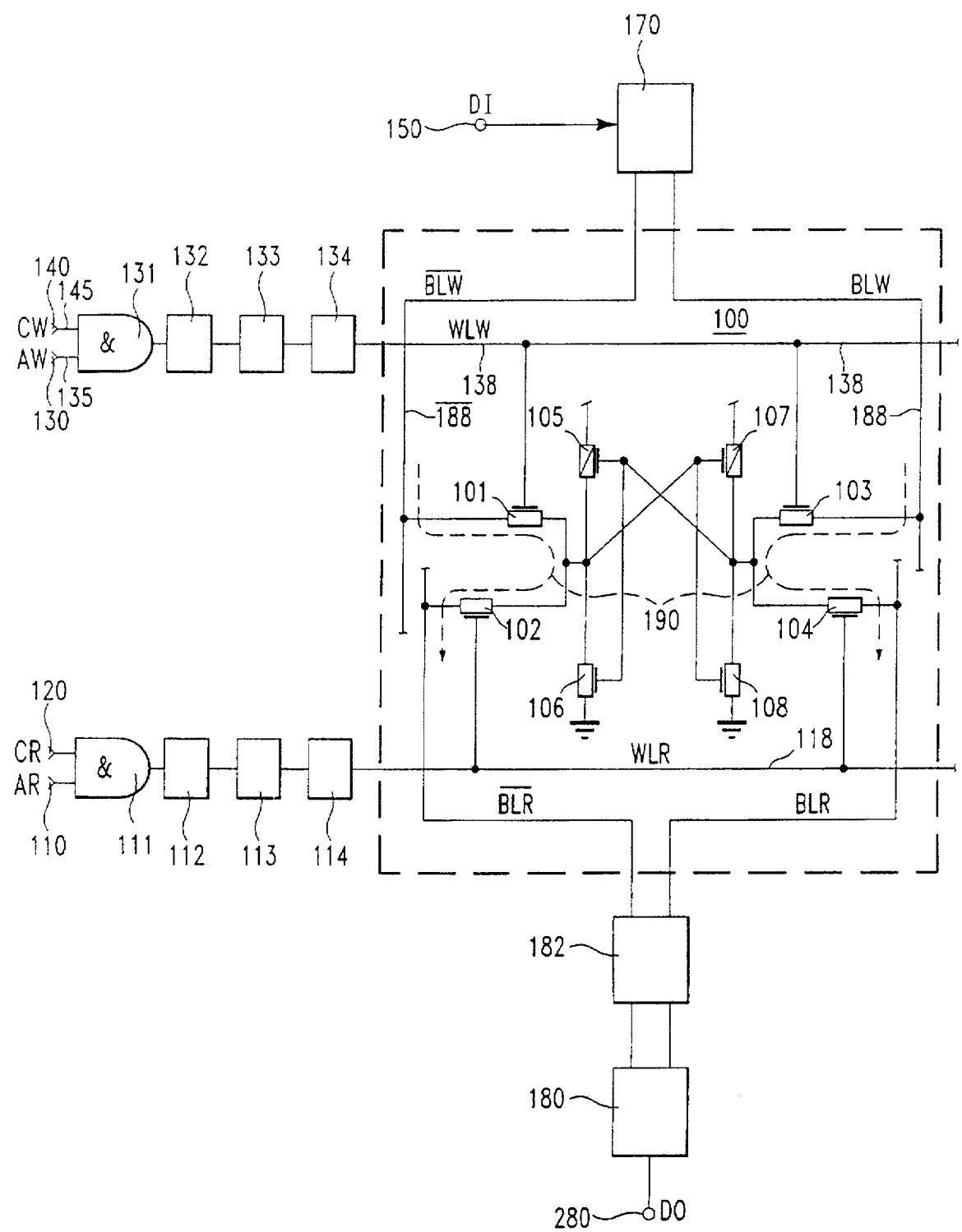
FIG. 1 shows a prior art two-port memory array with a two-port cell
Figure 3:
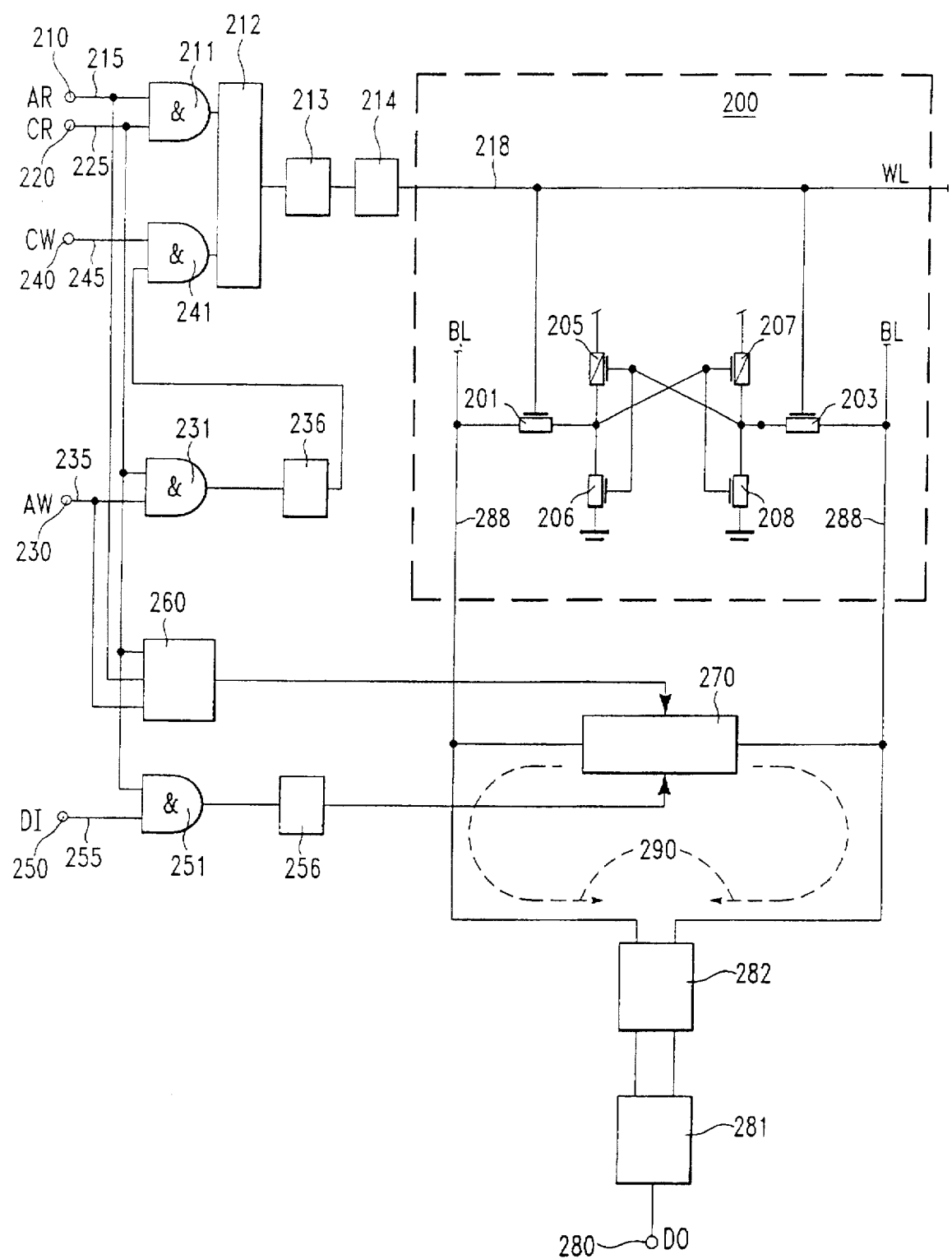
FIG. 3 shows the virtual two-port memory structure of the present invention

FIG. 3 illustrates a preferred embodiment of the current invention. It comprises a single-port memory cell 200 with WL wordline 218 for accessing the cell and BL bitlinepair 288. Read address signals AR appear at the read address terminal 210 and are directed to an AND gate 211 whose other input is the clock signal on line 225 from read clock 220. From the AND gate 211 the clocked read address signal is passed to a phase splitter 212, a decoder 213, a driver 214 and finally to wordline 218 of the cell 200 from which data is to be read.

Write address signals AW appear at the write address terminal 230 and are directed to an AND gate 231 whose other input is the clock signal on line 225 from read clock 220. From the AND gate 231 the clocked write address signal is passed to storage means 236. The stored signal in storage means 236 and a clock signal on line 245 from write clock 240 are the input for AND gate 241 which passes the signal to wordline 218 of cell 200 via the same phase splitter 212, decoder 213 and driver 214 in use together with AND gate 211.

The means 260 for comparing addresses receives its input from the read address terminal 210, the read clock 220 and the write address terminal 230.

The means 260 for comparing addresses is connected to means 270 for forcing a write operation and for bypassing the written data to the data output terminal 280 as well.

Data available at the data input terminal 250 are directed to AND gate 251 whose other input is the clock signal on line 225 from read clock 220. The output of the AND gate 251 is connected to the means 270 for forcing a write operation and for bypassing the data to be written into the cell to the data out terminal 280 as well.

Storage means 256 allows to store the data-in information if necessary.

Dotted lines 290 indicate the write-thru path between the means 270 for writing and bypassing and the bitlines 288 directly leading to the sense amplifier 282.

The data to be read from the single-port cell are transferred to the data out terminal 280 by the bitline pair 288 via a sense amplifier 282 and a data out latch 281. There are no further decoders or multiplexers necessary in the data path between the sense amplifier 282 and the data out terminal 280.

The single-port memory cell 200 itself comprises six transistor elements 201, 203, 205, 206, 207 and 208 symmetrically arranged in a way to form a well-known bistable flip-flop array commonly used for storing information.

The write-thru operation 290 shown in FIG. 3 can be described referring to FIG. 4. The timing diagram shows a read/write operation occuring during the first array cycle time $T_1$ and a write-thru operation occuring during the second cycle time $T_2$. The read operation and the write operation within the first array cycle time $T_1$ are carried out subsequently. The first part of the cycle is dedicated to the read operation. Simultaneously to the reading operation all the signals relevant for the subsequent write operation (data in information, write address) are gathered and stored in the storage means 236,256.

After the read operation being finished and the restore being carried out the write operation immediately starts and is also finished within the first cycle time $T_1$. During the write operation the wordline is selected with the same circuit group which was active during the read operation but now using the write address already stored in the storing means 236.

The read and write operations as well as the write-thru operation are controlled by a timing chain with the help of a read clock 220 and a write clock 240. The timing chain is started by an external clock CE at the beginning of each array cycle T.

For the purpose of illustration it is assumed that a logical "1" is to be written into and read from the cell during the second array cycle time $T_2$, the write-thru cycle. In this case the read address AR and the write address AW have already been compared by the means for comparing 260 at the beginning of the cycle $T_2$ and read and write address are matching.

The writing and bypassing means 270 is activated immediately and pulls down the bitline thus forcing the logical "1" onto the bitline BL and thus the newly written content of the cell is available at the sense amplifier 282 and the data out latch 281. Thus the information written into the cell is available at the data out terminal 280 within the same array cycle $T_2$ and the access time $t_{acc}$ remains the same.

This write-thru function may easily be implemented and shows the same performance as the normal read operation. As the smallest available standard cell may be used and no additional phasesplitter, decoder and driver for selecting the wordline are required a high array density is achieved. Shorter bitlines and wordlines used in this solution further enhance the performance of the cell.

Figure 5:
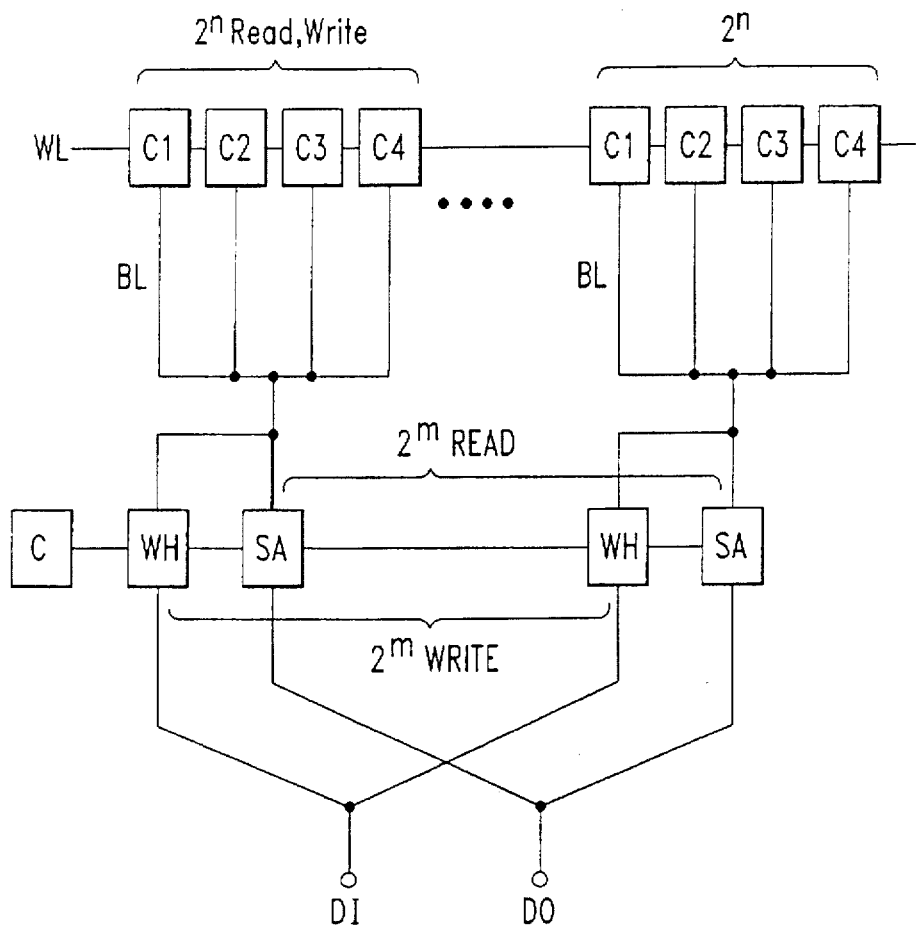
FIG. 5 schematically shows two groups of cells and their connection to the data output terminal.

FIG. 5 schematically shows two of m groups of cells with $2^n$ cells Cl ... Cn in each group. The read paths of all cells within one group are identical and are connected to a write head WH and a sense amplifier SA.

One sense amplifier SA and one write head WH belong to one group of cells Cl ... Cn and their respective read path represented by the bitlines. One cell of said group of cells is selected via the low-order bits n of the cell address.

In a write-thru situation the data to be written into a cell are gated to the sense amplifier SA connected to the group of cells the selected cell belongs to. Thus the data to be written into the selected cell are available in the read data path and at the sense amplifier.

Data available at the sense amplifier are gated to the data-out terminal DO by the high-order read address bits m. Data from the data-in terminal DI are gated to the write head WH by the high-order write address.

In order to detect a write-thru situation it is no longer necessary to compare the complete read and write addresses; it is sufficient to compare with comparator C only the low-order bits n of the cell's address which identify a cell out of the group of cells connected to the same sense amplifier.

The multiplex unit used in prior art solutions to compare the n+m address bits when putting the read out information onto the read path to the data-out port is no longer necessary.

The delay caused by the multiplex device is omitted and the advantages of the virtual two-port cell requiring less chip space are maintained.

We claim:

1. Virtual two-port memory structure comprising:

a single port memory cell (200) with a read address terminal (210), a write address terminal (230), a data input (250) and a data output (280) terminal;

means for comparing (260) a read address AR with a write address AW;

a bidirectional transfer device (270) for writing data from said data input terminal (250) into said cell (200) and for bypassing said data to said data output terminal (280) as well and internal timing means including a write clock (240) and a read clock (220) for controlling the timing of said single-port memory cell (200), said means for comparing (260) and said bidirectional transfer device for writing and bypassing data (270);

wherein said means for comparing (260) is connected to said read address terminal (210), to said write address terminal (230), to said read clock (220) and to said bidirectional transfer device for writing and bypassing data (270) such that a write-thru operation is immediately enabled if the read address AR matches the write address AW.

2. Method for writing data into a single-port memory cell (200) and reading the written data from the single-port cell within the same cycle time comprising selecting a read address AR and a write address AW comparing said read address AR and said write address AW if said read address AR and said write address AW are matching carrying out a write-thru operation with the steps:

setting up said matching address on the wordline WL and on the bitline BL performing a write operation and writing the data-in information into the memory cell (200) and bypassing the data-in information to be written into the memory cell (200) to the sense amplifier (282) in the read path.

3. A virtual two-port memory structure according to claim 1 wherein said means for comparing the read address AR with the write address AW can determine coincidence between the read address AR and the write address AW by reference to the low order bits (n) of the read address AR and the write address AW.

4. A method according to claim 2 wherein said comparing step only requires a comparison of the low order bits (n) of the read address AR and the write address AW to determine if the read address AR and the write address AW are matching.

* * * * *